(12) United States Patent
Fisher-Jeffes et al.

(10) Patent No.: US 8,027,375 B2
(45) Date of Patent: Sep. 27, 2011

(54) SHARED FILTER DESIGN FOR PILOT SYMBOL AVERAGING IN RAKE FINGERS IN WCDMA SYSTEMS

(75) Inventors: Timothy Fisher-Jeffes, Cambridge, MA (US); Dilip Muthukrishnan, Cedar Park, TX (US)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 805 days.

(21) Appl. No.: 12/103,201

(22) Filed: Apr. 15, 2008

(65) Prior Publication Data
US 2008/0267263 A1 Oct. 30, 2008

Related U.S. Application Data

(60) Provisional application No. 60/925,277, filed on Apr. 19, 2007.

(51) Int. Cl.
*H04B 1/00* (2006.01)

(52) U.S. Cl. ......................... 375/150; 375/343
(58) Field of Classification Search .................. 375/150, 375/152, 343
See application file for complete search history.

(56) References Cited

U.S. PATENT DOCUMENTS

| 7,454,209 B2 * | 11/2008 | Subrahmanya ............... 455/441 |
| 7,613,227 B2 * | 11/2009 | Rouphael et al. ............. 375/142 |
| 7,817,760 B2 * | 10/2010 | Black et al. .................... 375/355 |
| 2004/0248541 A1 | 12/2004 | Park | |

FOREIGN PATENT DOCUMENTS

| WO | WO 97/50173 A | 12/1997 |
| WO | WO 01/17185 A1 | 3/2001 |

* cited by examiner

*Primary Examiner* — Dac Ha
(74) *Attorney, Agent, or Firm* — Winston Hsu; Scott Margo (57) ABSTRACT

A rake receiver having a shared moving average filter that is operable in a multiplexed manner to receive and filter outputs from a plurality of pilot signal correlators.

16 Claims, 7 Drawing Sheets

| Addr | Content | | Content |
|---|---|---|---|
| 0x000 | early, finger 0, antenna A, QI sample 0 | | finger 0, even QI sample, correlator 0 |
| 0x001 | early, finger 0, antenna A, QI sample 1 | | finger 0, even QI sample, correlator 1 |
| ⋮ | ⋮ | | ⋮ |
| 0x00f | early, finger 0, antenna A, QI sample f | | finger 0, even QI sample, correlator f |
| 0x010 | early, finger 0, antenna B, QI sample 0 | | finger 0, odd QI sample, correlator 0 |
| 0x011 | early, finger 0, antenna B, QI sample 1 | | finger 0, odd QI sample, correlator 1 |
| ⋮ | ⋮ | | ⋮ |
| 0x01f | early, finger 0, antenna B, QI sample f | | finger 0, odd QI sample, correlator f |
| 0x020 | early, finger 1, antenna A, QI sample 0 | | finger 1, even QI sample, correlator 0 |
| ⋮ | ⋮ | | ⋮ |
| 0x03f | early, finger 1, antenna B, QI sample f | | finger 1, odd QI sample, correlator f |
| 0x040 | early, finger 2, antenna A, QI sample 0 | | finger 2, even QI sample, correlator 0 |
| ⋮ | ⋮ | | ⋮ |
| 0x11f | early, finger 8, antenna B, QI sample f | | finger 8, odd QI sample, correlator f |
| 0x120 | | | finger 9, even QI sample, correlator 0 |
| ⋮ | | | ⋮ |
| 0x1ff | | | finger f, odd QI sample, correlator f |
| 0x200 | on-time, finger 0, antenna A, QI sample 0 | | antenna A, finger 0, QI accum lsb, correlator 0 |
| 0x201 | on-time, finger 0, antenna A, QI sample 1 | | antenna A, finger 0, QI accum lsb, correlator 1 |
| ⋮ | ⋮ | | ⋮ |
| 0x20e | on-time, finger 0, antenna A, QI sample e | | antenna A, finger 0, QI accum lsb, correlator e |
| 0x20f | on-time, finger 0, antenna A, QI sample f | | antenna A, finger 0, QI accum lsb, correlator f |
| 0x210 | on-time, finger 0, antenna B, QI sample 0 | | antenna A, finger 0, QI accum msb, correlator 0 |
| 0x211 | on-time, finger 0, antenna B, QI sample 1 | | antenna A, finger 0, QI accum msb, correlator 1 |
| ⋮ | ⋮ | | ⋮ |
| 0x21f | on-time, finger 0, antenna B, QI sample f | | antenna A, finger 0, QI accum msb, correlator f |
| 0x220 | on-time, finger 1, antenna A, QI sample 0 | | antenna A, finger 1, QI accum lsb, correlator 0 |
| ⋮ | ⋮ | | ⋮ |
| 0x31f | on-time, finger 8, antenna B, QI sample f | | antenna A, finger 8, QI accum msb, correlator f |
| 0x320 | | | antenna A, finger 9, QI accum lsb, correlator 0 |
| ⋮ | | | ⋮ |
| 0x3ff | | | antenna A, finger f, QI accum msb, correlator f |
| 0x400 | late, finger 0, antenna A, QI sample 0 | | antenna B, finger 0, QI accum lsb, correlator 0 |
| ⋮ | ⋮ | | ⋮ |
| 0x51f | late, finger 8, antenna B, QI sample f | | antenna B, finger 8, QI accum msb, correlator f |
| 0x520 | | | antenna B, finger 9, QI accum lsb, correlator 0 |
| ⋮ | | | ⋮ |
| 0x5ff | | | antenna B, finger f, QI accum msb, correlator f |
| 0x600 | tmpilot, finger 0, antenna A, QI sample 0 | | |
| 0x601 | tmpilot, finger 0, antenna A, QI sample 1 | | |
| 0x602 | tmpilot, finger 0, antenna B, QI sample 0 | | |
| 0x603 | tmpilot, finger 0, antenna B, QI sample 1 | | |
| 0x604 | tmpilot, finger 1, antenna A, QI sample 0 | | |
| ⋮ | ⋮ | | |
| 0x623 | tmpilot, finger 8, antenna B, QI sample 1 | | |

SHARED FILTER DESIGN FOR PILOT SYMBOL AVERAGING IN RAKE FINGERS IN WCDMA SYSTEMS

RELATED APPLICATION

This application claims priority to U.S. Patent Application No. 60/925,277 filed on Apr. 19, 2007, the contents of which are incorporated herein by reference.

FIELD OF THE INVENTION

The present invention relates to rake receivers.

BACKGROUND TO INVENTION

Radio telecommunications systems using code division multiple access (CDMA) transmit multiple channels simultaneously in the same frequency band.

Figure 1:
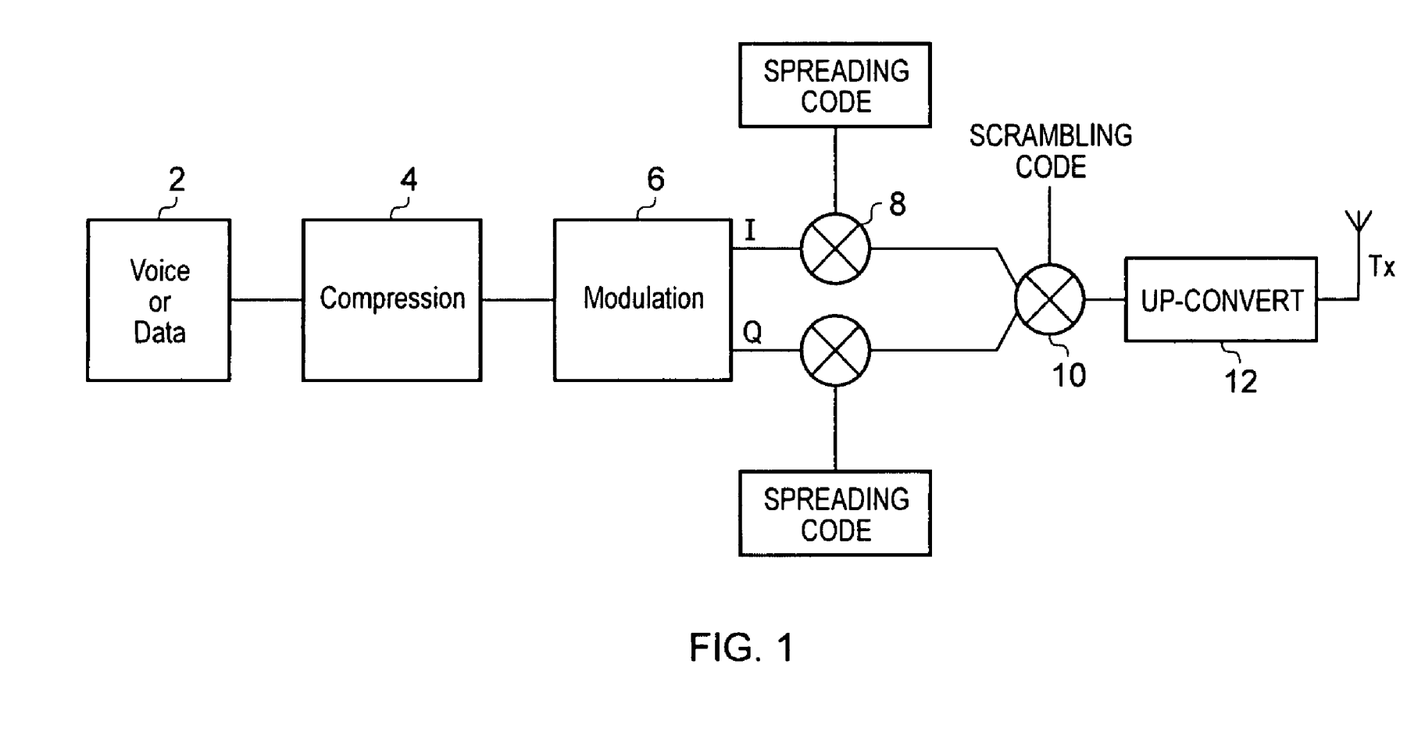
FIG. 1 schematically illustrates a transmitter for transmitting data in a CDMA communications system.

As shown in FIG. 1, a baseband signal 2 for transmission, which as used herein includes digital signals which may have been processed by a processor 4 to compress them, is modulated 6 using a modulation scheme such as Quaternary phase shift keying (QPSK) or quadrature amplitude modulation (QAM) so as to define a sequence of "symbols" that are to be transmitted.

The symbols which have both an in phase and imaginary component occur at a rate known as a symbol rate. The symbols from the modulator undergo two further processing operations prior to transmission.

The symbols are processed with a spreading code 8 so as to spread the data from each symbol. The spread data is then further multiplied by a scramble code 10 which is specific to the cell that the mobile or base station is operating in. The result of these processes is to generate "chips" which are then transmitted following up-conversion 12 to the desired transmit frequency.

Figure 2:
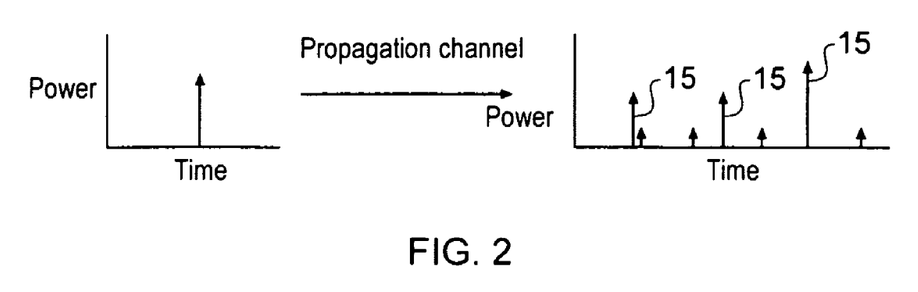
FIG. 2 schematically illustrates the effect of multi-path distortion within a transmission channel.

The spreading codes are selected such that they make the symbols mutually orthogonal. This condition applies whilst all of the chips are in time alignment (which is easy to achieve at the transmitter) but the occurrence of multiple transmission paths in the propagation channel between the transmitter and receiver can result in multiple versions of the same transmit sequence of chips arriving with different time delays and amplitudes at the receiver, as schematically shown in FIG. 2. To put this in context, the chip rate for UMTS systems is 3.84 M bits per second. This means that the radio wave carrying the chip propagates a little over 75 meters in one chip period. Consequently any path differences in excess of 75 meters enables two completely different chips to arrive at a receiver at the same time.

In reality the multi-path distortion may introduce time delays up to three hundred or so times the chip period.

As the chip rate is defined, the user/transmission system can trade off data rate with the length of the spreading code used to spread the data. Thus shorter spreading codes can be used to achieve higher data rates, but with the possibility of higher bit error rates occurring in the data transmission.

In order to recover the transmitted data it is known to use a rake receiver architecture to seek to re-align the various time displaced versions of the original signal.

Figure 3:
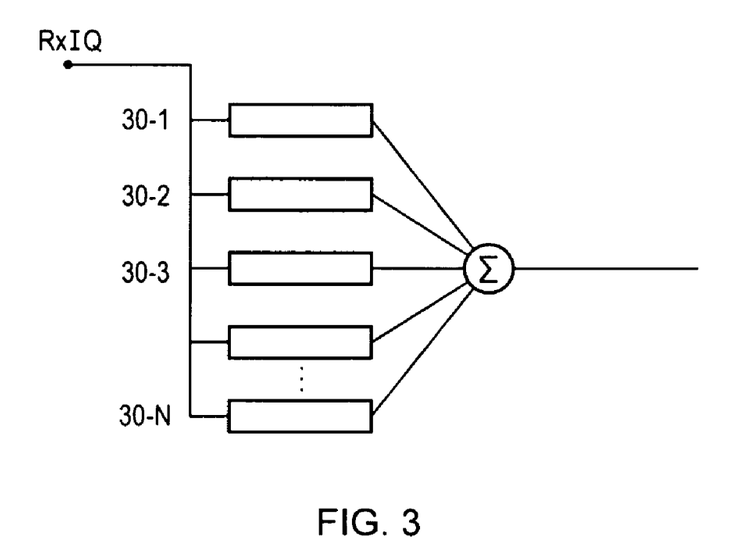
FIG. 3 schematically illustrates a prior art rake receiver.

A rake receiver is schematically shown in FIG. 3. It comprises a plurality of individual processing channels 30-1, 30-2 to 30-N, known as fingers. Each finger allows the relative time alignment between the received signal and a de-spreading code to be adjusted. This enables signal power from each significant transmission path to be recovered and brought into time alignment.

In prior art rake receivers, each finger comprises a plurality of correlators so as to integrate the correlation product of the incoming signal with the de-spreading and descrambling code.

Figure 4:
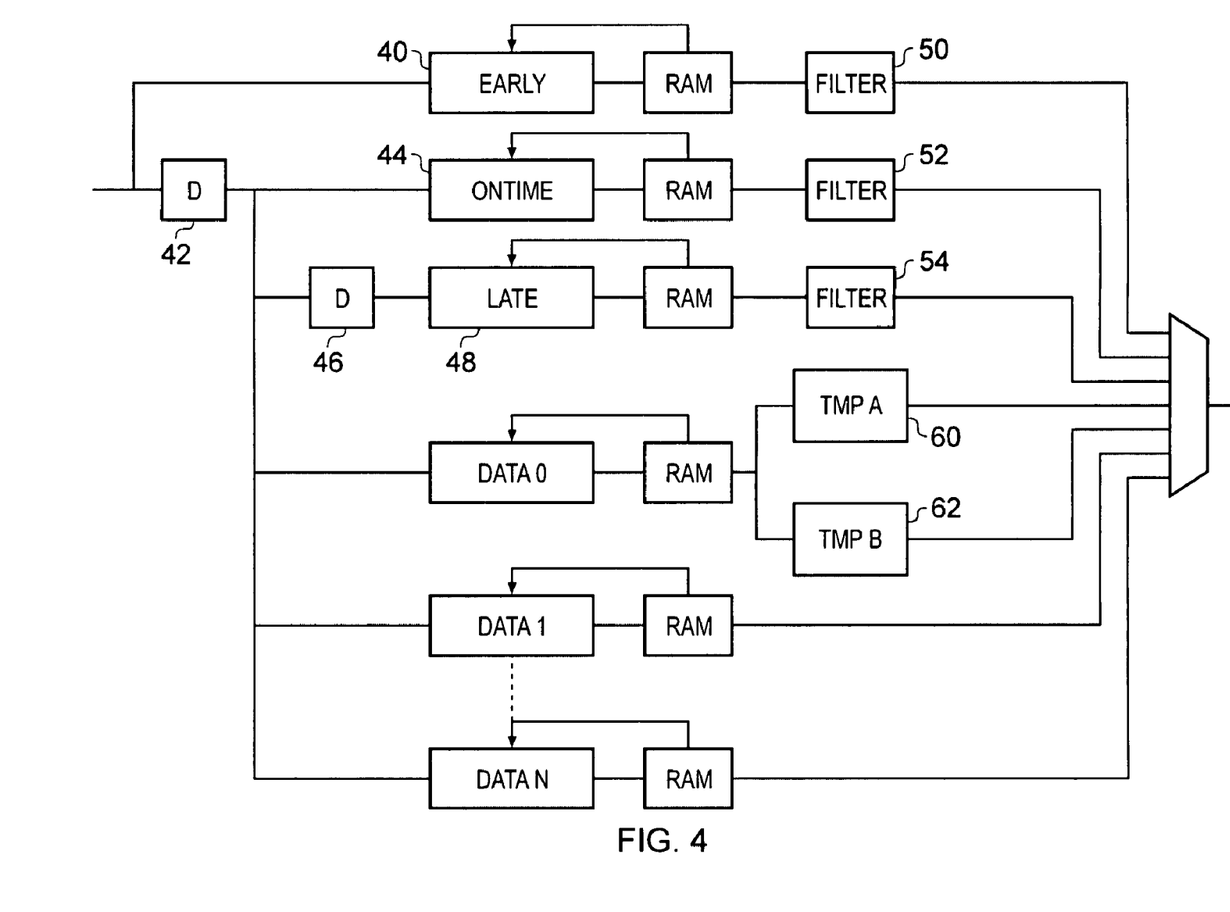
FIG. 4 schematically illustrates the internal configuration of a "finger" in a prior art rake receiver.

FIG. 4 schematically illustrates the functionality within known fingers of rake receiver. Each finger comprises several correlators. The correlators act to correlate the down converted and digitised signal $R_xI$ and $R_xQ$ provided by a radio frequency front end with descrambling signals provided by a local descrambling code generator which is known to the person skilled in the art and need not be described in detail here. The scrambling and de-scrambling codes are selected in a known manner and have the property that their autocorrelation function is very large if the codes are in correct temporal alignment and substantially zero otherwise.

Each finger has its delay set up by a process of estimating the channel response. Once set up, the finger uses a closed loop control to make sure that it is properly time aligned to within ½ chip with the signal it is seeking to receive.

Three correlators are provided with versions of the input signal, each slightly offset in time. An "early" correlator 40 receives an input directly from the RF front end. A delay of ½ chip is provided by a first delay element 42 and the output of the delay element is provided to an "on time" correlator 44 and data extraction correlators Data-0, Data-1 to Data-N. The output of the delay element is further provided to a second ½ chip delay element 46 who's output is provided to a "late" correlator 48.

Thus, when compared to the "on time" correlator the "early" correlator sees a time advanced version of the input and the late correlator sees a time delayed version of the input.

The "early", "on time" and "late" correlators examine the data to identify a known sequence called the common pilot channel (CPICH) which is also used in the process of characterising the communications channel. By correlating with the CPICH and filtering it the receiver can use the relative values of the early, on time and late correlators to check that it is properly aligned with the time delayed version of the signal that the particular finger has been assigned to, and to adjust its timing if necessary by modifying the timing of the de-spreading sequence with respect to an internal reference time.

The data could be decoded by a single channel but in a terminal conforming to the high speed data packet access category 6 standard the data could be in any one of twelve data channels. To ensure data recovery the fingers include a correlator for each of these twelve channels.

A time multiplexed pilot is used and as this is only carried on one physical data channel the correlator for this channel can be succeeded by two further correlators arranged to detect the A and B pilots, respectively, used in transmit diversity systems.

It can be seen that each rake finger itself consists of seventeen correlators data 0 to data 11, early, on time and late correlators for detecting the CPICH and correlators for detecting TMP A and TMP B.

This architecture repeated across several fingers of the rake receiver can take up significant space on a silicon die.

Filters 50, 52 and 54 following the early, on time and late correlators are moving average filters that filter the CPICH symbols over 512 chips. Filters are also provided in the time multiplexed pilot TMP A and TMP B blocks 60 and 62, and act to form a moving average over the length of a multiple of slots.

In the rake finger context, the pilot (CPICH and TMP) symbols are used for phase rotation. Filtering provides a less noisy version of the pilot symbols. To account for variations in the speed of the mobile device, filtering can be done over 2 pilot symbols (fast moving) or 16 pilot symbol (slow moving). In the path searcher context, filtering is not required. However, it needs to be a running accumulation of all the CPICH symbols. This would suffice since the symbols are being more for power detection than phase detection.

As the filters only receive a symbol every time a spreading code length of chips has been received, it can be seen that the filter is updated only infrequently.

SUMMARY OF THE INVENTION

According to a first aspect of the present invention there is provided a rake receiver where a shared moving average filter is operable in a multiplexed manner to receive and filter outputs from a plurality of pilot signal correlators.

BRIEF DESCRIPTION OF THE DRAWINGS

The present invention will further be described, by way of non-limiting example only, with reference to the accompanying drawings, in which.

DESCRIPTION OF EMBODIMENTS OF THE INVENTION

The inventors have noted that existing pilot symbol filtering employs identical but independent engines for processing the early, on time and late CPICH symbols and the time multiplex pilot symbols on each finger. The filters form a moving average of the pilot symbols in the CPICH and data channels. The filter is required to process three CPICH (early, on time and late) symbols every 256 chips and two time multiplex pilots on the data channels every 2560 chips. Each sample is filtered in around 1.5 chips, or three chips if space time transmit diversity mode is enabled.

Figure 5:
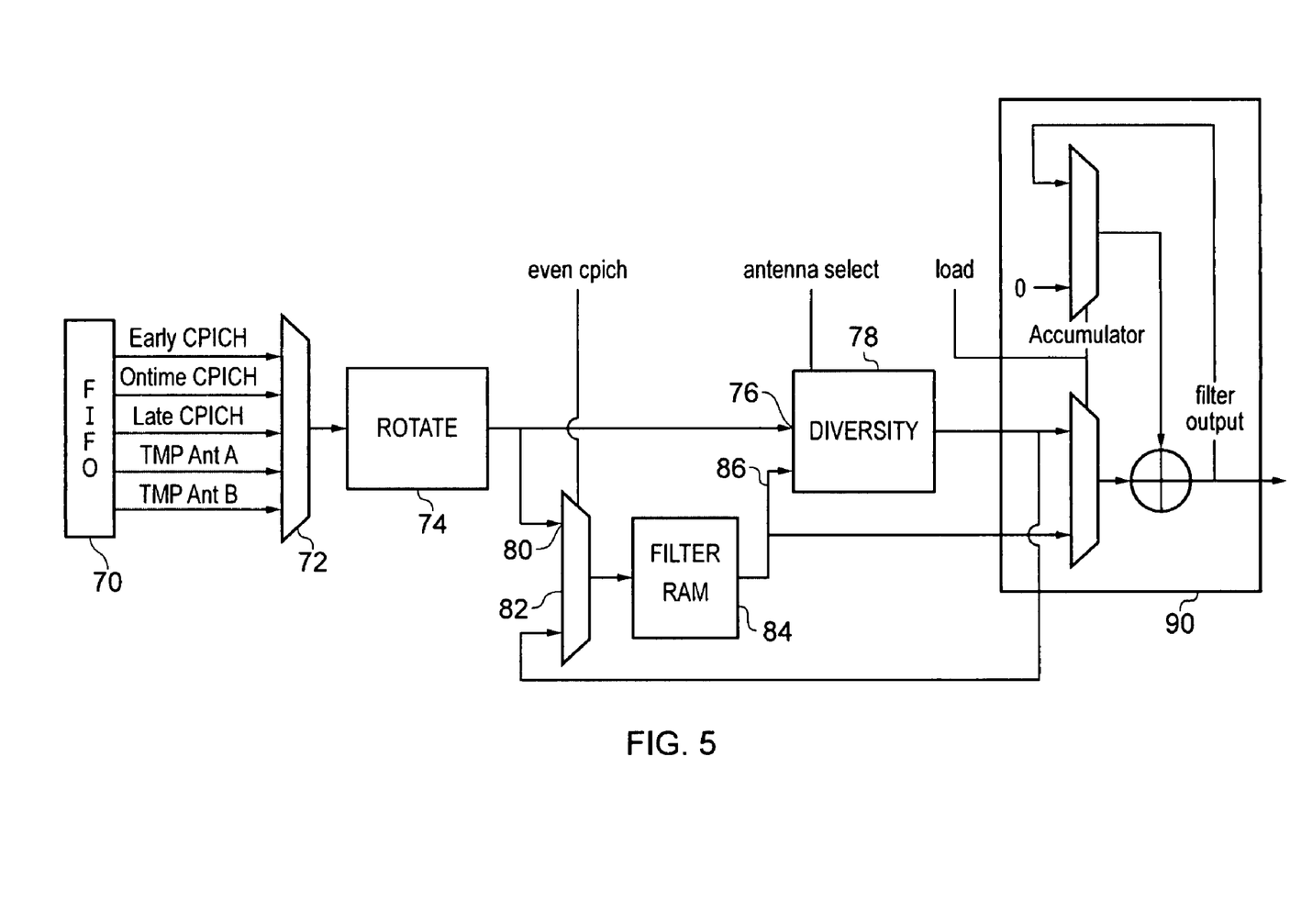
FIG. 5 is a schematic diagram of a time multiplexed filter for a rake receiver constituting an embodiment of the present invention.

The inventors have realised that a single processing unit can be operated in a multiplex manner to process each of the pilot signals. A pilot filtering apparatus constituting an embodiment of the present invention is shown in FIG. 5. The filter has a first in first out buffer 70 for storing/buffering the received input samples arriving from the correlators in the rake receiver fingers. Individual "channels" from the first in first out buffer can be selected by a multiplexer 72 for output to a rotator 74. An output of the rotator is provided to a first input 76 of a diversity block 78 and also to a first input 80 of a further multiplexer 82. An output of the multiplexer 82 is provided to an input of a filter memory 84. An output of the memory 84 is provided to a second input 86 of the diversity block 78 and also as input to an accumulator block 90. An output of the diversity block 78 is also available as an input to the accumulator 90.

It should be noted that the pilot symbols from the correlators (FIG. 4) arrive at a relatively low rate, but can be processed at a high rate. Therefore the first in first out buffer 70 provides the ability to absorb the input samples arriving from the correlators such that the pilot samples can be processed independently of the data correlation process. The samples can be processed in sequence, for example in the order early CPICH, on time CPICH, late CPICH, time multiplexed pilot antenna A and time multiplexed pilot antenna B.

The configuration shown in FIG. 5 allows the single rotate, diversity and accumulator logic to be shared by the filtering process for all pilot symbols and also to share a contiguous memory space within the memory 84.

Figure 6:
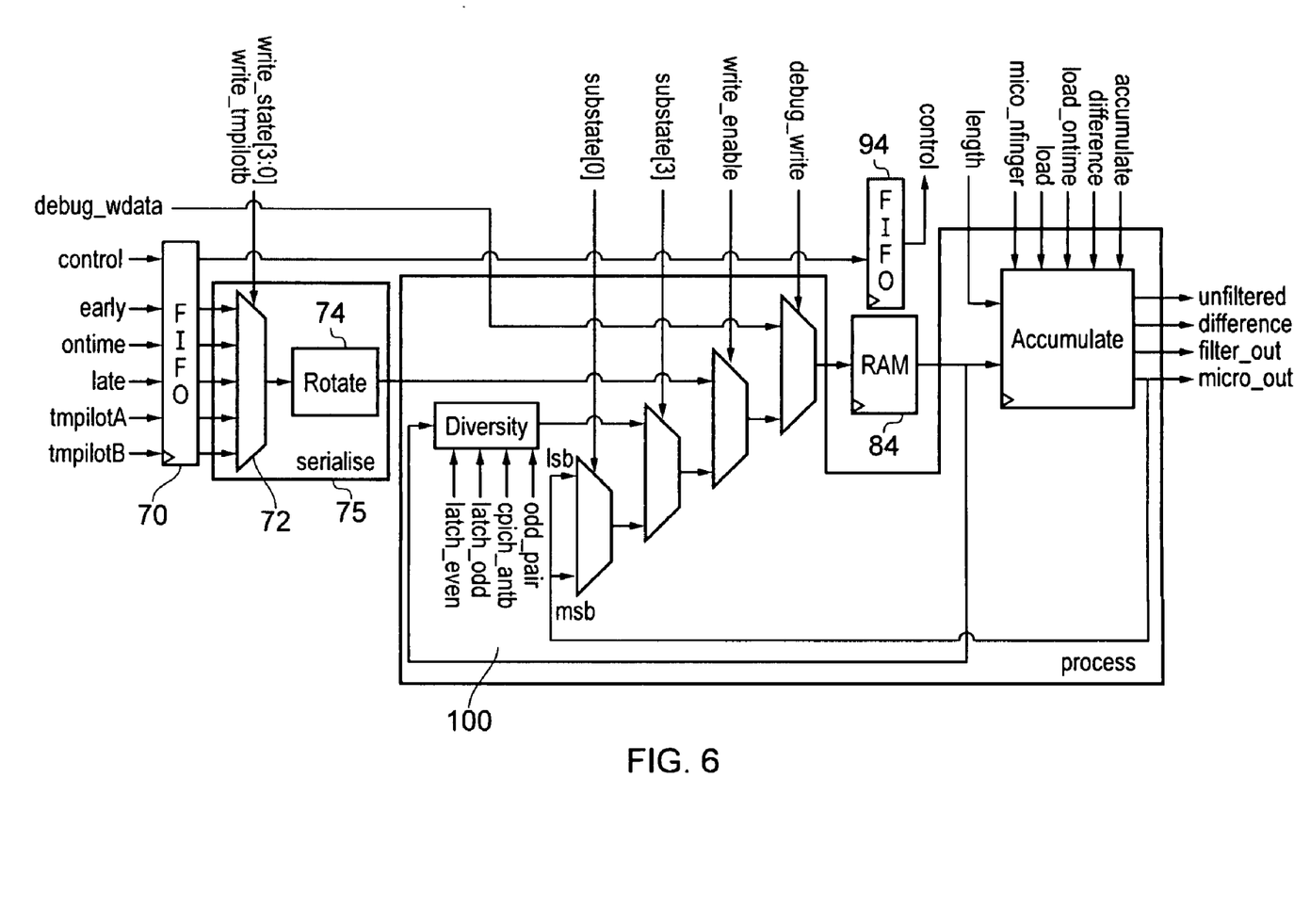
FIG. 6 shows the arrangement of FIG. 5 in greater detail.

FIG. 6 shows the implementation of FIG. 5 in greater detail. In particular the first in first out memory 70 is a wide FIFO acting as a parallel holding buffer for all pilot symbols received from the preceeding fingers that are to be filtered. The multiplexer 72 and rotator 74 act to form a filter serialiser 75 whose function is to serialise the very wide data path into early, on time, late, time multiplex pilot A and time multiplex pilot B symbols, to rotate them by $\pi/4$ and then to file them into the memory 70 of the filter.

CPICH symbols from the finger, TMP symbols and path searcher CPICH filters can all be handled by this arrangement and are all addressed slightly differently.

The rotation is performed by $$\text{rotate} = (\text{sample}_i + \text{sample}_q) + J \cdot (\text{sample}_q - \text{sample}_i),$$

where $\text{sample}_i$ is a sample of an inphase channel, $\text{sample}_q$ is a sample from a quadrature channel, and J is the imaginary operator. Once all serialisation operations have been handled, the first in first output buffer of a correlator preceding the pilot symbol filter is acknowledged and control information from the correlator first in first out memory is passed into a control FIFO 94 if filter processing is to be performed.

The averaging that is performed is only ever performed over a sequence of symbols whose total length is a power of 2. This is done to ensure that averaging can be performed by bit shifting rather than having to provide a circuit having a full divide operation. For CPICH symbols the length of the sequence specifies a multiple of 512 chip boundaries while for time multiplex pilot symbols the length of the averaging is specified as a multiple of slots. Each slot boundary is separated from its neighbour by 2560 chip boundaries. If the filter is used to implement path searcher functionality there is a 512 chip boundary search window to cope with, although filtering for a path searcher is done once per window length and there is no moving average functionality for path searcher processing and also no power to divide based on filter length.

It can be seen that different filtering functionality requires different storage of data within the memory. In particular, at system start up or out of a compressed mode gap, the length over which the symbols are filtered is increased from 1 through to the desired power of 2 length in step sizes that have powers of 2. This functionality is performed by a sub module, called a filter context module. Filtering can be seamlessly switched between any two of the "power of 2" lengths provided that valid entries exist in the FIFO to that length. As noted before, for the fingers, finger processing is performed on every incoming 512 chip symbol pair as a moving average over the window of the desired power of 2 in length. Filtering for path searcher processing is done once per window length, also a power of 2. There is no moving average processing for path searcher processing.

The inventors have noted that in order to maximise the efficient use of the shared filter memory (or alternatively to keep the amount of memory down to a minimum value and hence to reduce its impact on the silicon die) slightly different approaches to memory organisation need to be adopted for the finger CPICH symbols, the finger time multiplex pilot symbols and the path searcher symbols.

Figure 7:
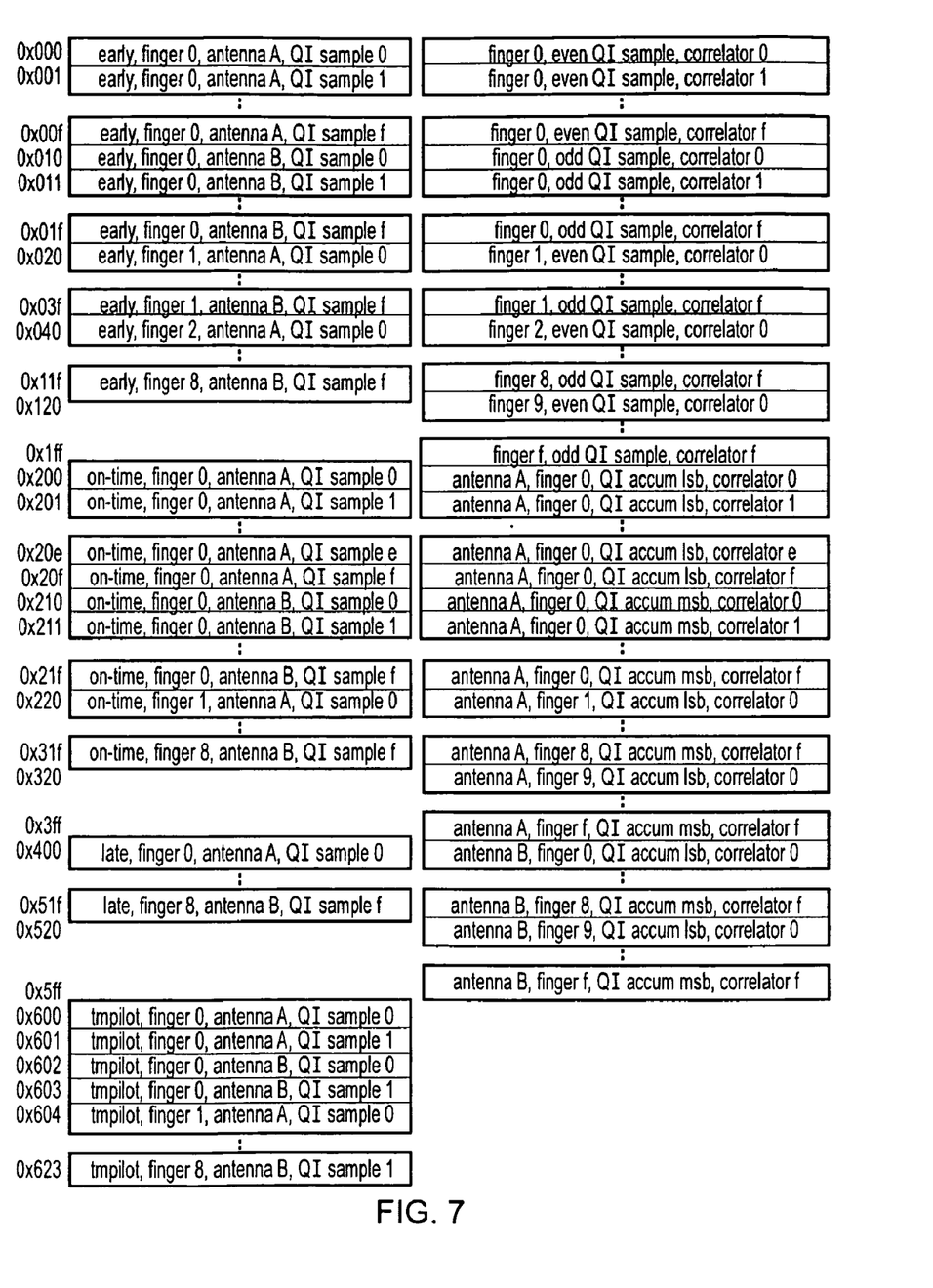
FIG. 7 shows an exemplary memory allocation for the filter memory.

During serialisation rotated pilot symbols are stored in the filter memory 84. For pilot symbols for each of the "fingers" of the rake receiver (whether the fingers be implemented as separate physical processing blocks or are logical fingers formed by operating a single physical finger in a time multiplexed manner) the filter memory is organised as a collection of circular buffers, 1 circular buffer per antenna pilot entity. Thus, for example, we have one buffer for the early CPICH signal for antenna A and one buffer for the early CPICH signal from antenna B, then a buffer for the on time CPICH signal from channel A, and so on. For CPICH filtering the circular buffers have 16 entries whilst for time multiplexed pilot signals the buffers only need to have two entries. This is shown in FIG. 7 which schematically represents memory organisation for the filter memory 84. The addresses shown within the memory allocation are relative addresses referenced to the first address of the memory and hence without limitation could be offset, if desired, by any value deemed appropriate by a designer choosing to implement this invention.

The organisation of the memory for the "finger" CPICH is in the form of 16 contiguous I Q paired side by side locations per antenna. Thus, I and Q sample pairs for sample 0, for the early correlator of finger 0, are allocated to address 0X000. The next address, 0X001 has I and Q sample pairs for sample one of the early correlator for finger 0 from antenna A. If, for brevity, we choose to designate the fingers by whether they are early, on time, or late, then followed by a finger number, antenna designation and sample number then we can say that addresses 0X000 to 0X00F are "early, finger 0, antenna A, Q I samples 0 to sample F (F in hexadecimal)" respectively. The next sixteen address 0X010 to 0X01F are allocated to "early, finger 0, antenna B, Q I samples 0 to F" respectively. The next sixteen allocations 0X020 to 0X02F are allocated to "early, finger 1, antenna A, Q I samples 0 to sample F", with the subsequent sixteen slots being allocated to early, finger 1, antenna B. This sequence is repeated for all the "early" fingers which, in this example, terminate with finger 8 antenna B. To allow for extensibility, for example to using more fingers or to using this architecture for path searching, unused areas sufficient for seven extra fingers have been left in the CPICH memory context allocation between addresses 0X120 and 0X1FF. This, however, is a choice exercised by the system designer and consequently leaving space in the memory allocation is not mandatory. The next block of memory deals with the "on time" correlators starting with finger 0, antenna A, Q I samples 0 to F in addresses 0X200 to 0X20F, respectively. We then move to on time, finger 0, antenna B samples 0 to F, then on time finger 1 antenna A, on time finger 1 antenna B, on time finger 2 antenna A and so on. Finishing with on time, finger 8, antenna B samples 0 to F at address 0X31F. Once again a block of memory space for seven extra fingers has been left in the memory allocation before starting the "late" finger allocations at address 0X400 and following the pattern as described hereinbefore with respect to the early and on time allocations, such that the late finger allocation finishes at 0X51F. Once again a space in the memory allocation is then left for a further seven fingers. Time multiplex pilot symbols are then stacked on top of this memory structure, again with two contiguous locations per antenna per finger such that TM pilot finger 0, antenna A, Q I sample 0 is address 0X600, TMP pilot finger 0, antenna A, Q I sample 1 is at address 0X601, TM pilot finger 0 antenna B Q I sample 0 is at address 0X602, TMP pilot finger 0 antenna B Q I sample 1 is at address 0X603, TM pilot finger 1 antenna A Q I sample 0 is at address 0X604 and so on.

Because CPICH filtering is done over 512 chip intervals in 256 chip even symbol pairs followed by 256 chip odd symbol pairs then both the even and then odd 256 chip symbols from the correlators need to be stored before they can be decoded for space time transmission diversity (STTD). These chip symbols from the correlators are also stored in a predictable sequence within the memory. The designer has a choice about how to allocate storage for this data, and broadly can trade memory width against memory depth. In the example shown in FIG. 7 a decision has been made to increase the width of the memory so as to avoid unduly increasing the depth of the memory. Thus the width of address X000 has been increased so that part of the memory allocated to that address can store the even Q I sample from finger 0, correlator 0. Similarly address 0X001 has extended such that part of the memory can store the even Q I sample for finger 0 from correlator 1. If we choose to describe the data in the sequence finger number, whether the samples are even or odd, and then correlator number, then we see a pattern emerging where the memory allocation runs finger 0, even samples, correlators 0 to F then finger 0, odd samples, correlators 0 to F. We then move on to finger 1, even sample correlator 0 to F then finger 1, odd samples, correlator 0 to F, then finger 2, even samples then finger 2 odd samples, then finger 3 all the way up to finger F odd samples, correlator F at address 0X1FF. The control for the circular buffer is controlled by a free running CPICH symbol counter and the free running slot counter, this data being passed to the filter engine of FIG. 6 through the FIFO 94 of the finger timer control module. It can be seen from inspection of FIG. 7 that during serialisation even CPICH symbols are filled into the free running antenna A locations and odd CPICH symbols are filled into the free running antenna B locations.

After STTD decoding, antenna A symbols are stored back into the same locations where the even 256 chip symbols were retrieved from and antenna B symbols are stored back into the same locations where the odd 256 chip symbols were stored. No diversity decoding is required for time multiplex pilot symbols as they had already been separated into antenna A and antenna B symbols at a preceding correlator stage.

If the arrangement shown in FIG. 6 is also to be used for path searcher CPICH filtering as well finger CPICH filtering, then the same functionality is required except that for path searcher applications the accumulation is done on-the-fly. The reason for this to save filter memory 84 and to speed up the filtering operation. As a result path searcher CPICH filtering memory organisation is very different to that required for finger CPICH filtering memory organisation. The maximum power of 2 length required for path searcher CPICH filtering is 8×512 chip symbols=4096 chip symbols worth. To store all of this would require a significantly larger memory. However since path searcher CPICH filtering is a one shot process there is no need to implement a circular buffer arrangement for this filtering. Instead the filtering buffer locations can be reused as accumulators and the accumulations required by the filter can be done on the fly as new 512—chip symbols are processed.

Thus, as shown, from address 0X200 up the extra width of the memory is used to store data for the path searcher filtering operation. If we adopt the nomenclature of describing the data by antenna (A or B) then finger number, then accumulator bit position from the least significant bit to the most significant bit (expecting the correlator word to be stored in two portions) and then correlator number, we see that addresses 0X200 to 0X20F store antenna A, finger number 0, accumulator least significant bits for correlator 0 to correlator F, respectively, the next sixteen addresses 0X210 to 0X21F store antenna A, finger 0, Q I accumulator most significant bits for correlator 0 to correlator F, respectively. This sequence is then repeated for antenna A fingers 1 to F and then repeated for antenna B. It can be seen that one of the accumulation values are stored and retrieved from the shared filter memory 70 each time a new path searcher filtering operation is to be performed. The running accumulation for antenna A is stored in finger "on time" locations the running accumulation for antenna B is stored in the finger "late" locations. Finger "early" locations are used to store the current even 256 chip/antenna A and odd 256 chip/antenna B symbols in the same way that the CPICH symbols both pre and post STTD decoded symbols are stored. Since the maximum filter CPICH filter length is sixteen and the number of path searcher correlators is also sixteen, there is no wasted shared space in the filter memory 84.

A filter processor 100 represents the processing engine underpinning the shared filter. It performs all of the remaining operations required to compute a filtered pilot output. This includes any space/time transmit diversity (STTD) decoding that needs to be performed. It also includes the accumulation and any subsequent divide by a power of 2 processing that may be required. For finger CPICH on time filtering extra unfiltered CPICH symbols and CPICH difference values are also calculated and sent to the combiner interface by the filter process module 100.

Three finite state machines control the filter process module. One is a simple counter counting 0 to 3 for the finger filtering which maps to the early, on time, late and time multiplexed pilot calculations respectively. The same counter can be modified to count 0 to 15 for path searcher filter to count CPICH correlators.

The second finite state machine is a very simple state machine with only two states representing antenna A or antenna B processing. The third state machine acts to control the order in which the various processing functions is achieved.

In use, if an entry is written into the control FIFO a filter FIFO valid signal, which in the art is called a semaphore, is generated and serviced by the filter processing module 100. All CPICH symbols whether from a filter or a path searcher are separated into antenna A and antenna B symbols through STTD encoding. If no STTD encoding is present, then the antenna B decoding is skipped. The decoding of the CPICH symbols is done over two consecutive even then odd 256 chip CPICH symbol pairs. During serialisation these were stored in filter RAM 84. Antenna A symbols are stored in those locations where even 256 chip symbols were retrieved from antenna B symbols are stored in those locations where the odd 256 chip symbols were stored. No diversity decoding is required for the time multiplex pilot symbols as they had already been separated into antenna A and antenna B symbols at the correlator stage.

For finger pilot processing the filter processing module then does an accumulation (and subsequent average) over the appropriate filter length for CPICH or TMP filtering, as requested by software (DIVERSITY->FILTER). For path-searcher CPICH filtering the end function is the same as for finger CPICH filtering except that the accumulation is done on-the-fly. The reason for this is to save filter RAM and to speed up the filtering operation. Running accumulation values are stored and retrieved from the shared filter RAM each time a new path-searcher filtering operation is to be performed. The LSB of the running accumulation is stored in the finger ontime locations while the MSB of the running accumulation is stored in the finger late locations. Finger early locations are used to store the current even 256-chip/antenna A and odd 256-chip/antenna B symbols. Since the maximum finger CPICH filter is 16 and the number of path-searcher correlators is also 16, there is no wasted shared space in the shared filter RAM. For finger CPICH ontime filtering, extra unfiltered CPICH and CPICH difference values are also calculated and sent to the combiner interface.

During each complete filtering operation a request to send data is sent to either the combiner or the power binning interface. This request must be acknowledged before the filter engine will move on. Once all filtering operations are handled, the filter control FIFO is acknowledged.

Figure 8:
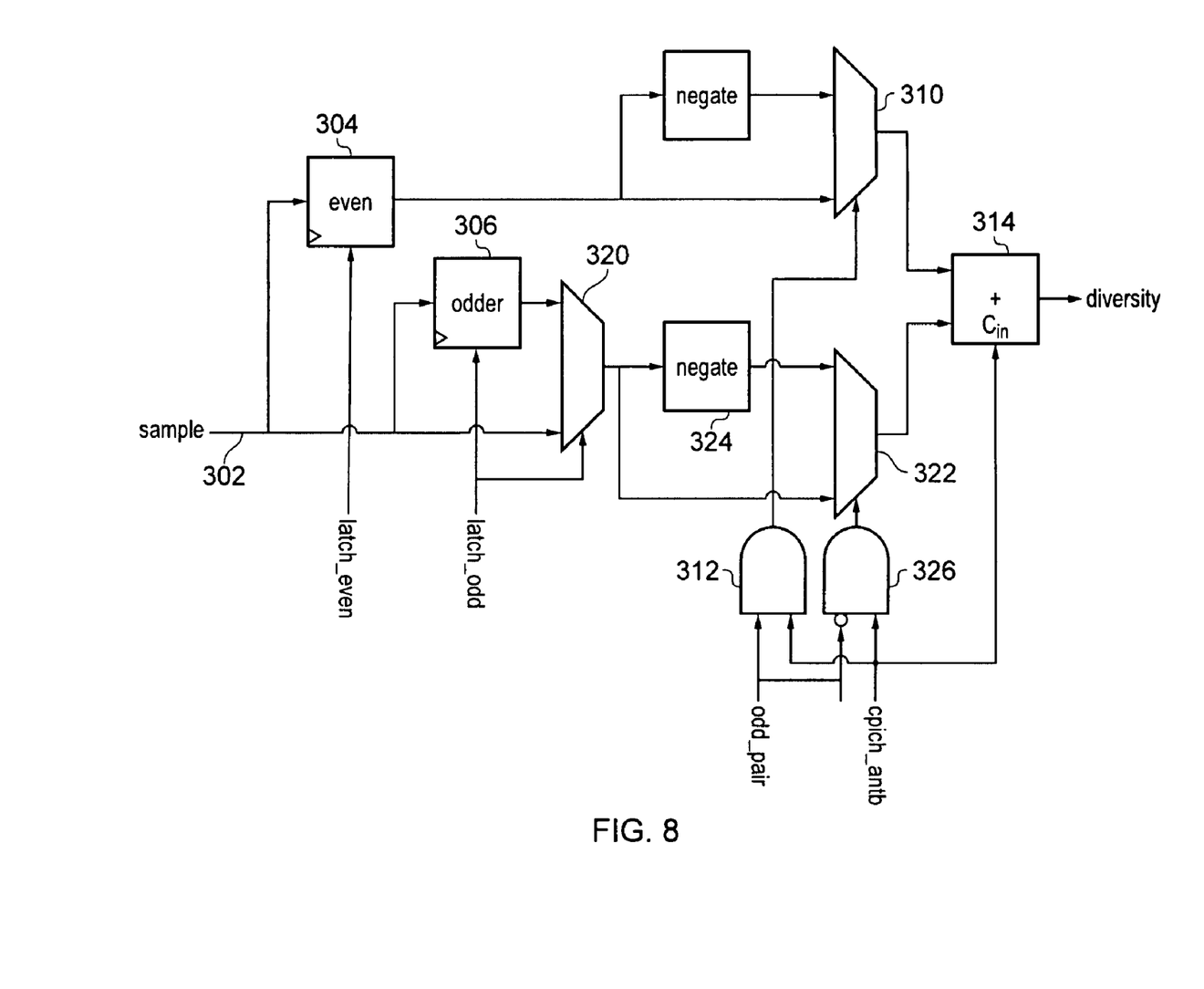
FIG. 8 shows a diversity calculation block.

The arrangement shown in FIG. 6 also includes a diversity calculation block. A circuit diagram of this block showing its functionality is shown in FIG. 8.

The diversity calculation module contains logic and registers to perform STTD decoding of the CPICH that was originally decoded by the base station. The encoding for a CPICH on antenna A is such that it transmits "++++++" etc every 256 chips where "+" represents transmitting the I Q symbol without modification. Hence for antenna A adding consecutive 256 chip sequences will give 2 Pa where Pa represents the phase reference of the CPICH symbol The encoding for CPICH on antenna B transmits "+--++--+" etc every 256 chips where "–" represents negation of the values of the transmitted chip every 256 chips. Hence for antenna B subtracting consecutive 256 chips would give +/–2Pb, negating this subtraction operation every alternate 512 chips would give 2Pb. Every 512 chips the even and odd data are combined in the STTD operation performed to separate antenna A and antenna B. The diversity decoding operations are $$\text{diversity}_{A,m \cdot 512} = \text{rotate}_{even, 2 \cdot m \cdot 256} + \text{rotate}_{odd, 2 \cdot m \cdot 256 + 1}$$

$$\text{diversity}_{B, 2 \cdot n \cdot 512} = \text{rotate}_{even, 2 \cdot m \cdot 256} - \text{rotate}_{odd, 2 \cdot m \cdot 256 + 1}$$

$$\text{diversity}_{B, 2 \cdot n \cdot 512 + 1} = -\text{rotate}_{even, 2 \cdot m \cdot 256} + \text{rotate}_{odd, 2 \cdot m \cdot 256 + 1}$$

of consecutive 256 CPICH symbol pairs.

The CPICH diversity calculator has a first input 302 to which an output of memory 84 is presented. This is then latched into either an even latch 304 or an odd latch 306 in response to a clock signal (the clock not being shown) and latch control signals latch_even and latch_odd. The output of the even latch 304 is provided to a first input of a multiplexer 310 and in a negated form to a second input of the multiplexer 310.

The multiplexer 310 is responsive to an AND gate 312 which forms a AND of an odd_pair signal and a CPICH_antb signal. An output of the multiplexer 310 is connected to a first input of adder 314. A second multiplexer 320 has its first input connected to an output of the register 306 and its second input connected to the sample input 302. The multiplexer is responsive to a latch_odd signal used to control the latch 306. An output of multiplexer 320 is provided to a first input of a further multiplexer 322 and to a negator 324 which provides its output to a second input of the multiplexer 322. The multiplexer 322 is driven by an AND gate 326 which is responsive to a CPICH_antenna B signal and to the inverted version of the odd_pair signal. The output of the multiplexer 322 is provided to a second input of the adder 314. Thus the adder acts to form a diversity signal which is then selected by the multiplexers shown in FIG. 6 for propagation to the memory 70, when the appropriate conditions are met.

On start up or when exiting from a compressed mode gap, the length over which symbols are to be filled with this increase from 1 to the desired power of 2, for example 16, length in power of 2 steps. The change in the filtering length occurs each time the filter contains a sufficient number of symbols to support the new increased length. Thus filtering within the filter can be seamlessly switched between any filter length (which satisfies the condition that it is a power of 2) provided that valid entries to that length exist. In order to achieve this, it is necessary to keep track of the number of valid entries in the shared filter memory that have been accumulated, and to round this number down to the nearest power of 2 when specifying the maximum filter length that can be supported.

The valid number of entries in the shared filter memory will always start from 0 at start up and even when exiting from a compressed mode gap, even when that gap is of the shortest permissible duration, which is three slots. The reason for this is that the filter length for the CPICH is a maximum of sixteen 512 chip elements which amounts to a little over three slots. The information in the filter memory after the minimum gap of three slots will simply not be current enough for a channel estimate. The CPICH filter needs to have produced at least one filtered symbol by the end of the first data symbol after a compressed mode gap to have a valid channel estimate for maximum ratio combining. In order to achieve the CPICH correlators must have started correlating at least 512 chips prior to the slot boundary preceding the first data symbol. This gives a window in which the CPICH filter can be cleared to length 1.

The invention claimed is:

1. A rake receiver comprising a shared moving average filter that is operable in a multiplexed manner to receive and filter outputs from a plurality of pilot signal correlators, wherein at least one buffer is provided to store a plurality of output values from a pilot signal correlator prior to providing the signals to the filter.

2. A rake receiver as claimed in claim 1, wherein the rake receiver is further configured for transmit mode diversity, and the shared moving average filter is further arranged to form averages of time multiplexed pilots.

3. A rake receiver as claimed in claim 1, wherein a multiplexer is provided for selecting pilot data to be supplied from the at least one buffer to the filter.

4. A rake receiver as claimed in claim 1, wherein the moving average filter and rake receiver are operable as a path searcher.

5. A rake receiver as claimed in claim 1, wherein the filter comprises an accumulator and a store, and the store comprises a plurality of memory addresses, each allocated to a specific pilot signal.

6. A rake receiver as claimed in claim 5, wherein each specific pilot signal is allocated a block of memory addresses.

7. A rake receiver as claimed in claim 6, wherein the block of memory is organized as a circular buffer.

8. A rake receiver as claimed in claim 5, in which when the receiver is used for path searcher CPICH filtering the memory locations within a buffer are used as accumulators.

9. A rake receiver as claimed in claim 1, where the filter is associated with a filter processor which performs the operations to add an accumulated value to an incoming value.

10. A rake receiver as claimed in claim 9, in which the filter processor performs space/time transmit diversity decoding.

11. A rake receiver as claimed in claim 10, in which after space time transmit diversity decoding symbols for a first antenna are stored back into locations used for even chip symbols and symbols for a second antenna are stored back into locations used for odd chip symbols.

12. A rake receiver comprising a shared moving average filter that is operable in a multiplexed manner to receive and filter outputs from a plurality of pilot signal correlators, wherein the rake receiver is further configured for transmit mode diversity, and the shared moving average filter is further arranged to form averages of time multiplexed pilots.

13. A rake receiver comprising a shared moving average filter that is operable in a multiplexed manner to receive and filter outputs from a plurality of pilot signal correlators, wherein the filter comprises an accumulator and a store, and the store comprises a plurality of memory addresses, each allocated to a specific pilot signal;

and each specific pilot signal is allocated a block of memory addresses.

14. A rake receiver as claimed in claim 13, wherein the block of memory is organized as a circular buffer.

15. A rake receiver comprising a shared moving average filter that is operable in a multiplexed manner to receive and filter outputs from a plurality of pilot signal correlators, wherein the filter is associated with a filter processor which performs the operations to add an accumulated value to an incoming value, the filter processor performs space/time transmit diversity decoding, and after space time transmit diversity decoding symbols for a first antenna are stored back into locations used for even chip symbols and symbols for a second antenna are stored back into locations used for odd chip symbols.

16. A rake receiver comprising a shared moving average filter that is operable in a multiplexed manner to receive and filter outputs from a plurality of pilot signal correlators, wherein the filter comprises an accumulator and a store, and the store comprises a plurality of memory addresses, each allocated to a specific pilot signal;

and when the receiver is used for path searcher CPICH filtering the memory locations within a buffer are used as accumulators.

* * * * *